United States Patent [19]

Hsieh et al.

[11] 4,295,065
[45] Oct. 13, 1981

[54] LEVEL SHIFT CIRCUIT

[75] Inventors: Peter K. Hsieh, Parsippany; Richard M. Vaccarella, Raritan, both of N.J.

[73] Assignee: RCA Corporation, New York, N.Y.

[21] Appl. No.: 65,841

[22] Filed: Aug. 13, 1979

[51] Int. Cl.³ ............... H03K 19/092; H03K 19/094; H03K 19/20

[52] U.S. Cl. ................................. 307/475; 307/451

[58] Field of Search ............ 307/205, 270, 279, 289, 307/264, 251, DIG. 1

[56] References Cited

U.S. PATENT DOCUMENTS

| 3,675,144 | 7/1972 | Zuk | 307/205 X |
|---|---|---|---|
| 3,728,556 | 4/1973 | Arnell | 307/251 |
| 3,755,690 | 8/1973 | Smith | 307/205 |
| 3,801,831 | 4/1974 | Dame | 307/251 |
| 3,823,330 | 7/1974 | Rapp | 307/205 X |
| 3,900,746 | 8/1975 | Kraft et al. | 307/DIG. 1 X |
| 4,023,050 | 5/1977 | Fox et al. | 307/279 X |
| 4,031,409 | 6/1977 | Shimada et al. | 307/205 X |
| 4,080,539 | 3/1978 | Stewart | 307/DIG. 1 X |
| 4,216,390 | 8/1980 | Stewart | 307/DIG. 1 X |

Primary Examiner—Larry N. Anagnos
Attorney, Agent, or Firm—Samuel Cohen; Henry I. Schanzer

[57] ABSTRACT

A circuit adapted to receive at its input terminal signals having either a first or a second value includes a level shifting transistor for shifting the second value signals at its input terminal to a third value, where the second value is intermediate the first and third values. The transistor is turned on and off as a function of the voltage at a first node at which is produced the inverse of the input signals. An output terminal is coupled to the first node for one value of input signal and is decoupled from it for the other value of input signal. Decoupling enables the level shift transistor to always be operated as a function of the input signal while enabling signals incompatible with the signal at the first node, produced by other circuitry, to be present at, or applied to, the output terminal.

18 Claims, 6 Drawing Figures

LEVEL SHIFT CIRCUIT

This invention relates to level shift circuits.

Level shift circuits are often employed to propagate signals between different parts of an electronic system which operate at different voltage levels. For example, the output of a transistor transistor logic (TTL) circuit is usually specified as 2.4 volts for a logic "1" signal and 0.8 volt for a logic "0" signal. An insulated-gate field-effect (IGFET) circuit with an operating voltage of 5 volts requires a higher deviation (than the 0.8 volt to 2.4 volts) in the voltage levels at its input to switch the IGFETs between an "ON" and an "OFF" condition corresponding to the two binary states. Therefore, a level shift circuit is needed which can convert the signals at the output of the TTL circuit to signals capable of switching the IGFETs fully ON and fully OFF.

The level shift circuits should be compatible with the other circuits of the system with respect, among other things to minimization of power dissipation. In large systems such as memories, where many level shift circuits may be used, it is desirable to gate each level shift circuit to ensure that its output changes state only when a load has to be driven or when signals have to be propagated from one section to another. Gating of the level shift circuit reduces the power dissipation of the system since unnecessary charging and discharging of circuit nodes is avoided or reduced. The level shift circuit should also be of the type whose output can be combined with the outputs of other circuits to perform various logic and circuit functions.

A circuit embodying the invention is adapted to receive at its input terminal signals which can assume either a first or a second value and includes means for shifting the second value signals at its input terminal to a third value.

The circuit includes first and second power terminals to which are respectively applied a first voltage having said first value and a second voltage having said third value.

The circuit also includes a first, input signal responsive, means including means connected between one of the two power terminals and an output node and between the output node and a level shift control node for clamping the one of two power terminals to the output node and the output node to the level shift control node for one value of input signal and for decoupling the one of the two power terminals from the output node and the output node from the level shift control node for the other value of input signal. A second, normally non-conductive, input signal responsive means clamps the level shift control node to the other one of the two power terminals for the other value of input signal. A regenerative feedback means responsive to the voltage at the level shift control node clamps the input terminal to the one of the two power terminals to which is applied the potential of third value in response to an input signal having a second value.

In preferred embodiments additional circuit means are coupled between the output node and the level shift control node and between the output node and one of the two power terminals for selectively producing at the output node signals approximately equal to either the first or the third value.

The accompanying drawings in which like reference characters denote like components, FIGS. 3(*a* and *b*) and 4(*a* and *b*) are schematic diagrams of level shifting logic circuits embodying the invention.

Insulated-gate field-effect transistors (IGFETs) are the active devices preferred for use in practicing the invention. For this reason, the circuit is illustrated in the drawing as employing such transistors and will be so described hereinafter. However, this is not intended to preclude the use of other suitable devices and to this end, the term "transistor", when used without limitation in the appended claims is used in a generic sense.

In the FIGURES, enhancement type IGFETs of P conductivity type are identified by the letter P followed by a particular reference character; and enhancement type IGFETs of N-conductivity type are identified by the letter N followed by a particular reference character. The characteristics of IGFETs are well known and need not be described in detail. But, for a clearer understanding of the description to follow, definitions and characteristics of IGFETs pertinent to the invention are set forth in column 2 of U.S. Pat. Nos. 4,037,114 and 4,001,606 and are incorporated herein by reference.

In the discussion below each transistor is assumed to have a threshold voltage ($V_T$) of 1 volt. It is assumed that the gate potential ($V_G$) of an N type transistor must be more positive than its source potential ($V_S$) by 1 volt to turn-it-on and the gate potential ($V_G$) of a P type transistor must be more negative than its source potential ($V_S$) by 1 volt in order to turn-it-on.

Figure 1:
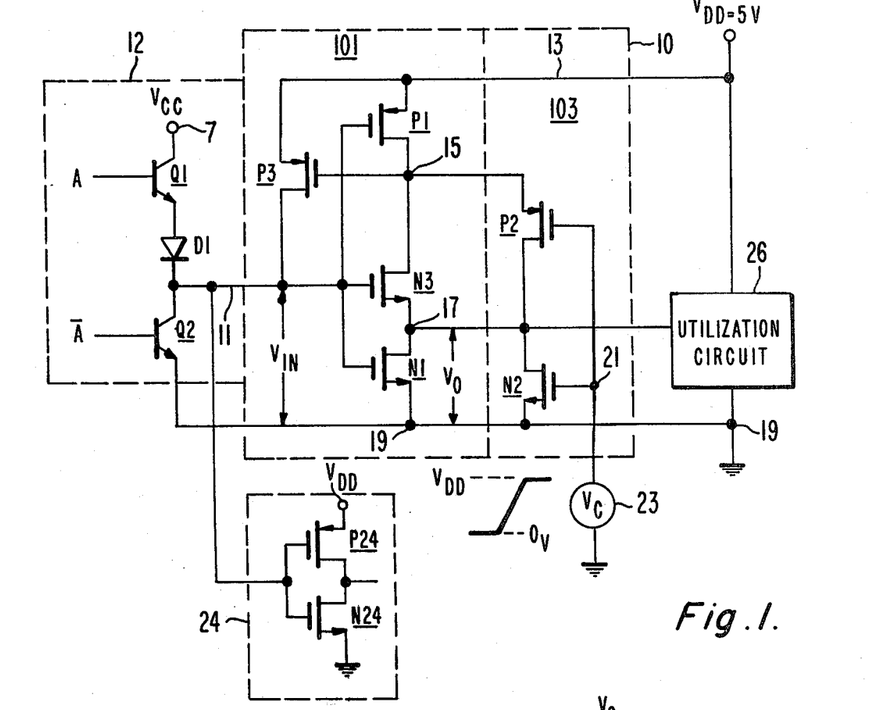
FIGS. 1 and 2 are schematic diagrams of gated level shift circuits embodying the invention.

The circuit of FIG. 1 includes a gated level shift control 10 having an input terminal 11 to which is applied signals derived from a TTL output stage 12. The TTL output stage includes a transistor Q1 whose collector-to-emitter path is connected in series with a diode D1 between a terminal 7, to which is applied $V_{CC}$ volts, and terminal 11. $V_{CC}$ volts may be, for example, in the range of 4 to 5 volts. The collector-to-emitter path of a transistor Q2 is connected between terminal 11 and terminal 19, the latter being at ground potential. When Q1 is turned on, Q2 is turned-off, and a "high" or logic "1" is applied to terminal 11. The potential represented by the high or logic "1" applied to terminal 11 may be close to $V_{CC}$ but, also may be as low as 2.4 volts even for $V_{CC}$ equal to 5 volts. When Q2 is turned on, Q1 is turned off, terminal 11 is clamped to ground via Q2 and a "low" or logic "0" is applied to terminal 11 which is normally at, or close to, ground but which may be also as high as 0.8 volt. Therefore, logic "0" signals are in a first restricted range of 0 to 0.8 volts and logic "1" signals are in a second range between 2.4 volts and $V_{CC}$ or $V_{DD}$ volts.

Circuit 10 includes a level shift portion 101 comprised of transistors P1, N1, P3 and N3 and a gating portion 103 comprised of transistors P2 and N2. Transistor P1 has its conduction path connected between power terminal 13 and node 15. The conduction paths of transistors P2 and N3 are connected in parallel between node 15 and an output terminal 17. The conduction paths of transistors N1 and N2 are connected in parallel between terminal 17 and a ground terminal 19. The gate electrodes of transistors P2 and N2 are connected to a terminal 21 to which is connected a source 23 of control (gating) signals, $V_C$. The conduction path of level shifting transistor P3 is connected between terminals 13 and 11 and its control electrode is connected to node 15.

The gate electrodes of P1, N1 and N3 are directly connected to terminal 11.

Transistors P1, N1, P3 and N3 function to level shift up the 2.4 volt input signal at terminal 11. That is, when the voltage at 11 represents a "1" and is anywhere within the range of 2.4 to 5 volts then the input level is shifted up to 5 volts. Transistors P3 and P1 are cross-coupled, with the turn-on of P3 controlled by N3 and N1. Since N1 and N3 are responsive to the signal at the input terminal 11, the turn-on of P3 and the level shift up operation is ensured regardless of the conduction conditions of P2 and N2.

In the discussion of the operation below, the following assumptions are made:

1. Ground or 0 volts is applied to terminal 19;
2. $V_{CC}$ volts applied to terminal 7 is more positive than ground and may range in value between 4 and 5 volts;
3. $V_{DD}$ volts is applied to terminal 13 where $V_{DD}$ volts is equal to or more positive than $V_{CC}$ volts and is, for example, equal to +5 volts;
4. Any voltage more positive than 2.4 volts (including any voltage more positive than $V_{DD}$ volts) is arbitrarily defined as "high" or logic "1", and any voltage below, or less positive than, 0.8 volts is arbitrarily defined as "low" or logic "0".
5. The voltage level of a logic "0" input signal initially applied to terminal 11 is equal to a maximum of 0.8 volt, while the voltage level of a logic "1" signal initially applied to terminal 11 is equal to a minimum of 2.4 volts.
6. The control signal, ($V_C$), applied to terminal 21 is either at, or close to, ground potential and is then defined as "low" or at, or close to, $V_{DD}$ volts, and is then defined as "high".

The operation of the circuit of FIG. 1 will first be examined for the condition when the potential ($V_{IN}$) at terminal 11 is equal to a "low" or logic "0" and then for the condition when $V_{IN}$ makes a transition from 0 volt to 2.4 volts, or more.

When $V_{IN}$ is low, (or less positive than 1 volt), transistors N1 and N3 are turned-off while transistor P1 is turned-on applying the $V_{DD}$ volts at terminal 13 to node 15. With the voltage ($V_{15}$) at node 15 equal to $V_{DD}$ volts, P3 is turned-off regardless of the value of the control voltage ($V_C$). The turn-off of P3 when $V_{IN}$ is low is necessary to avoid power dissipation which would otherwise result due to conduction from terminal 13 via the conduction paths of P3 and Q2 to ground (recall that Q2 is ON to produce $V_{IN}$=low). The turn off of P3 for $V_{15}$ low is achieved regardless of the condition of $V_C$ by connecting the gate of P3 to node 15 (rather than terminal 17). When P3 is off, Q2 does not have to "sink" any current and can, therefore, easily hold terminal 11 at, or close to, ground potential.

When $V_C$ is high (with $V_{IN}$=low) transistor P2 is turned off and N3 also is off isolating node 15 from terminal 17 while transistor N2 is turned on clamping terminal 17 to ground. Since transistors N3 and P2 are off, there is no low impedance conduction path between node 15 and output terminal 17. $V_{15}$ thus remains clamped to $V_{DD}$ volts and P3 is turned off. N2 is turned on and output terminal 17 is clamped at, or close to, zero with no steady state power dissipation, since P2 and N3 are turned off.

When $V_C$ is low (with $V_{IN}$-low), P2 is turned on and N2 is turned off. Node 15 is now coupled via the conduction path of P2-ON to terminal 17 and $V_O$ goes to $V_{DD}$. Since N1 is off due to $V_{IN}$-low and N2 is off due to $V_C$-low, there is no low impedance conduction path between terminal 17 and ground. Therefore, P1 and P2 which are ON and conducting in the common source mode can easily clamp node 15 and terminal 17 at, or close to, $V_{DD}$ volts. With $V_{15}$ at $V_{DD}$ volts the continued turn-off of P3 is ensured.

Thus, when $V_{IN}$ is low $V_{15}$ goes to, and remains at, $V_{DD}$ volts and P3 remains turned off regardless of $V_C$. But, $V_O$ is a function of $V_C$ and $V_{IN}$ with transistors P1, P2, N1 and N2 functioning as a NOR gate. When, $V_C$ and $V_{IN}$ are low, $V_O$ is equal to $V_{15}$ which is at $V_{DD}$; and when $V_C$ is high, $V_O$ is clamped to ground potential, regardless of the value of $V_{IN}$.

As soon as $V_{IN}$ exceeds 1 volt, transistor N1 and N3 begin to conduct while transistor P1 conducts less. As the conduction through N1 and N3 increases, $V_{15}$ decreases. As soon as $V_{15}$ is 1 volt below $V_{DD}$ volts, P3 begins to conduct and provides a relatively low impedance conduction path between terminals 13 and 11 causing the potential at the latter to rise towards $V_{DD}$. This, in turn, increases the conductivity of N1 and N3 which causes $V_{15}$ to decrease still further, further increasing the conductivity of P3 and causing $V_{IN}$ to rise still higher with the result that P1 is turned-off more and more, and N1 and N3 are turned-on more and more. The process continues until $V_{IN}$ is at $V_{DD}$, P1 if OFF, and N1, N3 and P3 are fully ON.

Thus, for $V_{IN}$ equal to, or more positive than, 2.4 volts, node 15 is clamped to ground via N3 and N1, P3 is turned-on eventually raising the input to $V_{DD}$ volts, and P1 is turned off regardless of the condition of $V_C$. For $V_C$ high and $V_{IN}$-high, $V_O$ is clamped to ground due to N1 and N2 being both on; and for $V_C$ low, $V_O$ is clamped to ground due to N1 being turned on.

Recall that for $V_{IN}$ to rise initially from 0.8 volt towards 2.4 volts, transistor Q1 is being turned on and Q2 is being turned off. When Q2 is fully turned off, it draws no current (except for leakage). As $V_{IN}$ rises above 2.4 volts, D1 becomes reverse biased, and blocks the possible flow of current from $V_{DD}$ via P3 and Q1 into $V_{CC}$. Thus, P3 need be only large enough to pass sufficient current to charge up the capacitance at node 11 to $V_{DD}$ volts within a desired rise time. In this instance there is also no steady state dissipation.

Thus, for an input signal at, or above 2.4 volts, $V_{IN}$ is level shifted up to $V_{DD}$ volts, and $V_{15}$ and $V_O$ go to zero volts regardless of the value of $V_C$.

For $V_C$ high (with $V_{IN}$-high) P2 is turned off and N2 is turned on. Since N1 is also on due to $V_{In}$ high, $V_O$ is clamped to ground via the conduction paths of N1 and N2 conducting in parallel.

For $V_C$-low (with $V_{IN}$-high) P2 is turned on and N2 is turned off. Terminal 17 is grounded via N1 and is also coupled via P2 to node 15, which is grounded via N1 and N3.

It has, therefore, been shown that for all values of input signals applied to terminal 11 equal to, or more positive than, 2.4 volts, the input at terminal 11 will be raised to, or close to, $V_{DD}$ volts. Also, when circuit 10 is enabled ($V_C$ is then "low"), the voltage ($V_O$) at output terminal 17 is equal to the inverse, or complement, of $V_{IN}$, and than when $V_C$ is "high", $V_O$ is low.

As noted above, connecting the gate electrode of transistor P3 to node 15 (rather than to output terminal 17) ensures that P3 is tuned on and off as a function of the voltage at node 15. Otherwise, if the gate of P3 were connected to terminal 17, whenever $V_O$ would be low P3 would be turned on even were $V_{IN}$ to be low. Since Q2 is ON when $V_{IN}$ is low, a current would flow from terminal 13 into terminal 11 and via Q2 to ground, resulting in substantial power dissipation. Therefore, it is important that P3 not be connected to terminal 17 but rather to node 15 whose potential varies (inversely) as a function of the input ($V_{IN}$). When $V_{IN}$ is high, N3 provides a conduction path between the gate of P3 and the drain of N1 whether P2 is on or off. This enables node 15 to be driven low, P3 to be on and $V_{IN}$ to be raised to $V_{DD}$ whenever $V_{IN}$ goes to 2.4 volts, or more, regardless of the status of $V_C$. When $V_{IN}$ is low, transistor N3 is off and decouples node 15 from output terminal 17. This enables node 15 to be driven to $V_{DD}$ and P3 to be turned off, while terminal 17 can be clamped to ground.

Examination of circuit 101 by itself indicates that:

1. When $V_{IN}$ is high, P1 is OFF; N1 and N3 are ON clamping node 15 and terminal 17 to ground, and P3 is ON clamping node 11 to $V_{DD}$.

2. When $V_{IN}$ low, P1 is ON clamping node 15 to $V_{DD}$, P3 is OFF due to the $V_{DD}$ at node 15, and N1 and N3 are OFF. For this condition terminal 17 is floating and isolated from node 15 (or ground).

The gating circuit 103 (or if desired other circuits) can then be connected between node 15 (at which a signal which is a function of $V_{IN}$ is produced) and output terminal 17 to produce an output which is a function of $V_{IN}$ or between output terminal 17 and either one of the power terminals depending on the function or combination of functions to be performed.

In the circuit of FIG. 1 there is no steady state low impedance path between terminals 13 and 19 (except during transitions) and there are no floating nodes. Also, the turned on transistors conduct in the common source mode ensuring fast action and excellent clamping.

In summary, it should be appreciated that the level shift portion 101 of circuit 10 (i.e. P1, N1, P3 and N3) is operative, independently of the gating signal, applied to terminal 21. But, whenever the gating signal places the circuit in an enabling mode, the complement of the input signal is produced at the output terminal 17.

A significant feature of level shifting the input signal whereby $V_{IN}$ is either at ground or at $V_{DD}$ volts is that an IGFET circuit 24, independent of circuit 10, can be directly connected to terminal 11. Circuit 24 may include, for example, a complementary inverter comprised of transistors P24 and N24 having their gated electrodes connected to terminal 11 and operated between $V_{DD}$ and ground. Due to the level shifting at the input terminal 11, P24 and N24 are operated either full-on or full-off with the resultant minimization of power dissipation. In addition to circuit 24, a utilization circuit 26 designed to be driven by the gated output at terminal 17 may be connected to terminal 17 as shown in FIG. 1.

Figure 2:
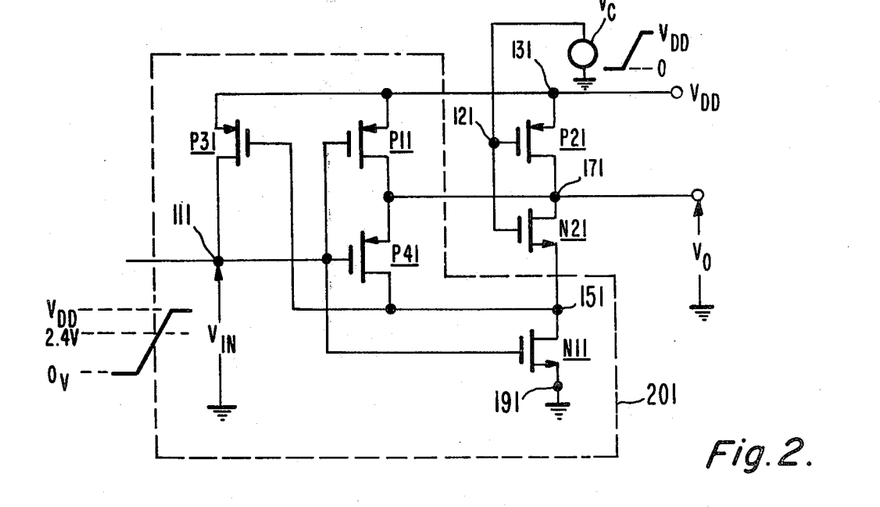

A gated level shift circuit may also take the form shown in FIG. 2 where the output is normally clamped "high" as in typical NAND gates rather than "low" as shown in FIG. 1. In the circuit of FIG. 2 the conduction paths of transistors P11 and P21 are connected in parallel between terminals 131 and 171. The conduction paths of transistors N21 and P41 are connected in parallel between terminal 171 and node 151. The conduction path of transistor N11 is connected between node 151 and terminal 191 which is at ground. The conduction path of transistor P31 is connected between terminals 131 and 111 and its gate electrode is connected to node 151.

The circuit includes a level shift portion 201 comprised of P11, N11, P31 and P41 and a gating portion comprised of P21 and N21. Logically, P11, P21, N11 and N21 function as a two-input NAND gate, in view of the output $V_O$ produced at terminal 171 in response to input signals $V_{IN}$ and $V_C$.

Assume that the signals and/or voltages applied to terminals 111, 131, 191 and 121 are the same as the signals and/or voltages, respectively applied to terminals 11, 13, 19 and 21 of FIG. 1.

When $V_{IN}$ is low, N11 is turned off while P11 and P41 are turned-on conducting in the common source mode and clamping terminal 171 and node 151 to $V_{DD}$ volts. The $V_{DD}$ volts at node 151 are applied to the gate of P31 turning-it-off.

When $V_C$ is low with $V_{IN}$ low, P21 is turned on and N21 is turned off. P21 as well as P11 then clamp terminal 171 to terminal 131 and $V_O$ and $V_{151}$ are then equal to $V_{DD}$. When $V_{CC}$ is high with $V_{IN}$ low, P21 is turned off and N21 is turned on. P11 and P41 still clamp $V_{DD}$ to terminals 171 and 151, respectively with N21 also coupling node 151 to terminal 171. Consequently, $V_O$ and $V_{151}$ are then equal to $V_{DD}$, but also represent the inverse of $V_{IN}$.

When $V_{IN}$ is high P11 and P41 are turned-off and no longer control terminal 171. N11 is turned on and node 151 is coupled to terminal 171 via the conduction path of N21. When $V_C$ is low N21 is turned off and the signal conditions at node 151 and terminal 171 are independent of each other. $V_{151}$, which is low, is the inverse of $V_{IN}$ which is high while $V_O$ is clamped to $V_{DD}$ via P21 which is turned on. When $V_C$ is high P21 is turned off and since P11 is also off there is no low impedance path between terminals 131 and 171. N21 is turned on and conducts in series with N11 clamping terminal 171 to ground potential.

The conduction of $V_{151}$ and $V_O$ for the various combinations of $V_{IN}$ and $V_C$ are summarized in the Table below.

| $V_{IN}$ | $V_C$ | $V_{151}$ | $V_0$ |
|---|---|---|---|
| Hi | Hi | Lo | Lo |
| Hi | Lo | Lo | Hi |
| Lo | Lo | Hi | Hi |
| Lo | Hi | Hi | Hi |

Figure 3A:
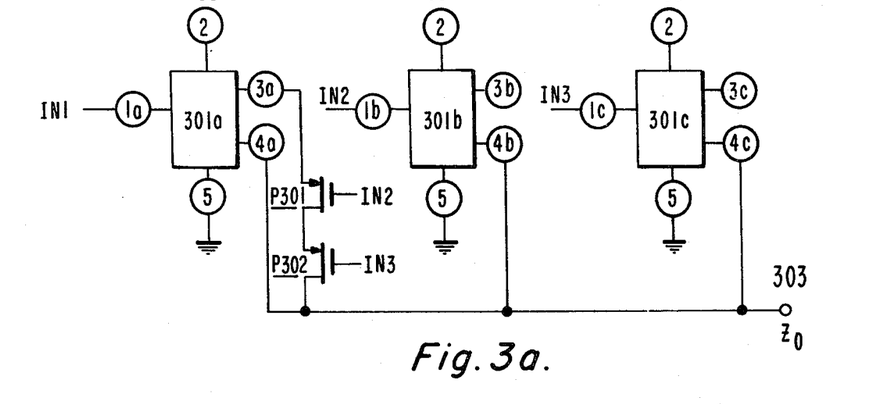
Figure 3B:
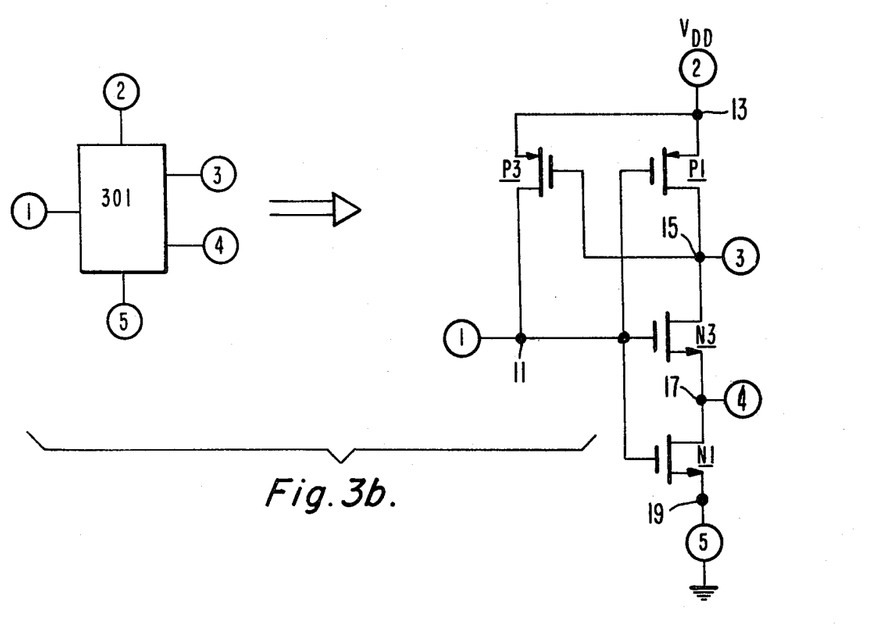

In FIGS. 1 and 2, one ($V_{IN}$) of the two input signals had to be level shifted while the second input signal (control signal, $V_C$) was assumed to have a value of either $V_{DD}$ or ground. FIGS. 3A and 3B illustrate how the level shift portion of circuit 10 in combination with a network comprised of transistors P301 and P302 may be used to form a 3-input NOR gate all of whose inputs (IN1, IN2, IN3) are, or have to be, level shifted.

FIG. 3A includes 3 level shift circuits (301a, 301b, 301c), each circuit 301 being of the type detailed in FIG. 3B and each being schematically identical to the circuit formed by transistors P1, N1, P3 and N3 in FIG. 1. Each circuit 301 has an input terminal 1, a first power terminal 2, to which is applied $V_{DD}$, a second power terminal 5 to which is applied ground potential, a node 3 responsive to the input signal for controlling the level shifting, and an output terminal 4. Terminals 1, 2, 3, 4 and 5 correspond, respectively to terminals 11, 13, 15, 17 and 19 of the level shift circuit shown in FIG. 3B and to the like numbered terminals in FIG. 1. The circuits 301 and certain terminals of the circuits 301 are identified by the letters a, b, and c, corresponding to IN1, IN2 and IN3, respectively.

The three input signals IN1, IN2, IN3 which may be either at 0 volt or at 2.4 volts are applied to the input terminals of circuits 301a, 301b, 301c respectively. The 2.4 volt inputs are level shifted to $V_{DD}$ volts as described above for FIG. 1. The signals at terminals 3a, 3b, and 3c are the logical inverse of IN1, IN2 and IN3, respectively, as described in FIG. 1. The output terminals 4a, 4b and 4c of circuits 301a, 301b, and 301c respectively, are connected in common to an output terminal 303 at which is produced an output signal $Z_O$.

When any one (or more) of the three input signals is "high" the output $Z_O$ is clamped to zero volts. The output $Z_O$ is clamped to $V_{DD}$ volts only when all of the inputs are low.

However, when all the inputs are low, the node 3 of each level shift circuit is high and the transistor N2 in each circuit coupling node 3 to output terminal 4, is turned off. $Z_O$ is driven high, when IN1=IN2=IN3 =low, by means of transistors P301, and P302 whose conduction paths are connected in series between terminals 3a and 303. IN2 and IN3 are applied to the gates of P301 and P302, respectively. When P301 and P302 are turned on, they provide, in combination with P1 of 301a which is responsive to IN1, a low impedance conduction path between the $V_{DD}$ line and terminal 303 when IN1=IN2=IN2=low. P301, P302 and P1 of 301a when turned on, conduct in the common source mode clamping terminal 303 to $V_{DD}$, and $Z_O$ is high.

Transistor P301 and P302 could alternatively be connected between node 3b and terminal 303 with the gates of P301 and P302 being connected to IN1 and IN3. Alternatively P301 and P302 could be connected between node 3c and terminal 303 with their gates being connected to IN1 and IN2.

Thus, the level shift circuit 301 (or 101) of the invention with a level shift control node (3) separate from its output terminal (4) may be used to form a NOR gate whose inputs are level shifted, and whose output may be at different levels than those of the level shift control nodes.

Figure 4A:
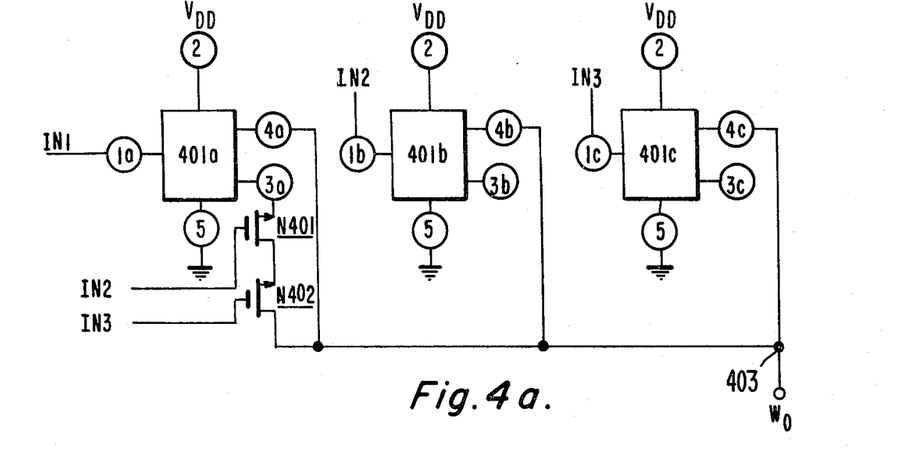
Figure 4B:
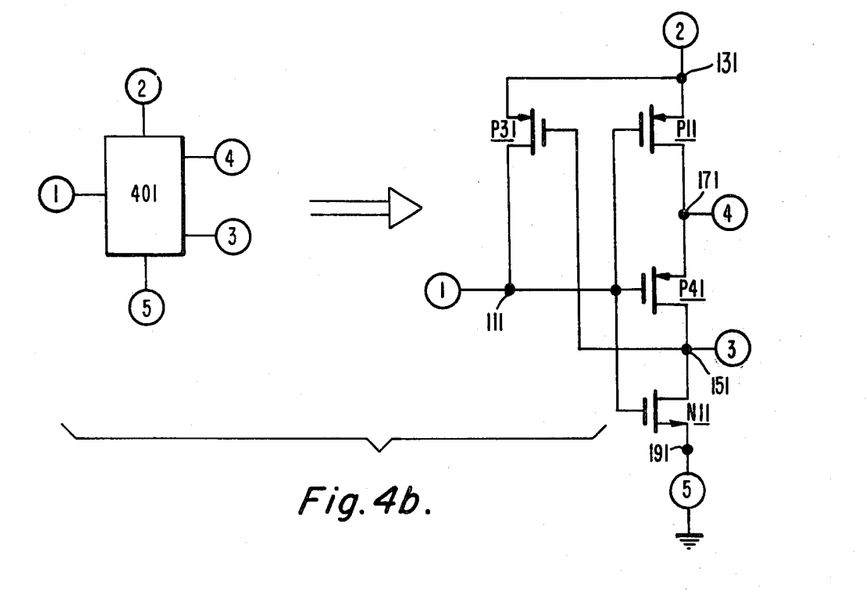

FIGS. 4A and 4B illustrate how the level shift portion 201 of FIG. 2 in combination with a network comprised of transistors N401 and N402 may be used to form a 3-input NAND gate all of whose inputs (IN1, IN2, IN3) are, or have to be, level shifted.

FIG. 4A includes 3 level shift circuits (401a, 401b, 401c), each circuit 401 being of the type detailed in FIG. 4B and each being schematically identical to the circuit 201 formed by transistors P11, N11, P31 and P41 in FIG. 2. Each circuit 401 has an input terminal 1, a first power terminal 2, to which is applied $V_{DD}$, a second power terminal 5 to which is applied ground potential, a node 3 responsive to the input signal for controlling the level shifting, and an output terminal 4. Terminals 1,2,3,4 and 5 correspond, respectively to terminals 111, 131, 151, 171 and 191 of the level shift circuit shown in FIGS. 4B and to the like numbered terminals in FIG. 2. The circuits 401 and certain terminals of the circuits 401 are identified by the letters a, b and c, corresponding to IN1, IN2 and IN3, respectively.

As for FIG. 3 the three input signals,IN1, IN2, IN3 may be either at 0 volts or at 2.4 volts, the 2.4 volts input levels are level shifted to $V_{DD}$ volts as described above for FIG. 2. The signals at terminals 3a, 3b and 3c are the logical inverse of IN1, IN2 and IN3, respectively, as described for circuit 201 in FIG. 2. The output terminals 4a, 4b and 4c of circuits 401a, 401b and 401c respectively, are connected in common to an output terminal 403 at which is produced an output signal $W_O$.

When any one (or more) of the three input signals is "low" the output $W_O$ is clamped to $V_{DD}$ volts. The output $W_O$ is clamped to ground (low) only when all of the inputs are high.

However, when all the inputs are high, the node 3 of each level shift circuit is low and the transistor P41 in each circuit coupling node 3 to output terminal 4, is turned off. $W_O$ is driven low when IN1, IN2 and IN3 are high by means of transistors N401 and N402 whose conduction paths are connected in series between terminals 3a and 403. IN2 and IN3 are applied to the gates of N401 and N402, respectively. When N401 and N402 are turned-on they provide, in combination with N1 of 401a which is responsive to IN1, a low impedance conduction path between terminal 403 and the ground line when IN1=IN2=IN2=low. N401, N402 and N11 of 401a when turned on, conduct in the common source mode clamping terminal 403 to ground and $W_O$ is low.

N401 and N402 could alternatively be connected between node 3b and terminal 403 with the gates of N401 and N402 being connected to IN1 and IN3. Alternatively N401 and N402 could be connected between node 3c and terminal 403 with their gates being connected to IN1 and IN2.

Thus, the level shift circuit of the invention with a level shift control node (3) separate from its output terminal (4) may be used to form a NAND gate whose inputs are level shifted, and whose outputs may be at different levels than those of the level shift control nodes.

In the circuits of FIGS. 3 and 4 a network had to be connected between the level shift control node (3) of one circuit and the output terminal (4) common to all the level shift circuits. For the 3 input gates shown two transistors were needed. Thus, for N level shift circuit forming an N-input gate, N-1 transistors would have their conduction paths connected in series between one of the nodes, 3, and the common output terminal; with the gate electrodes driven as per the examples of FIGS. 3 and 4.

In the circuits shown in the FIGURES, complementary IGFETs were used to illustrate the means for clamping (connecting via a low impedance path) or decoupling (connecting via a high impedance path), but, it should be evident that single conductivity type devices or other switch means could be used to practice the invention.

Also, in the FIGURES, only the shift up of a (e.g. 2.4 volt) signal to $V_{DD}$ has been illustrated. But, it should be evident, if the input signals were, for example, to be either $V_{DD}$ volts or another voltage intermediate $V_{DD}$ and ground, that the intermediate input signal would be level shifted down to ground potential.

What is claimed is:

1. The combination comprising:
first and second power terminals for the application therebetween of an operating potential;
an input terminal adapted to receive input signals having either a first value approximately equal to the potential applied to said first power terminal or a second value equal to a voltage intermediate the voltages applied to said first and second power terminals;

a level shift control node, and an output node;

a first input signal responsive means including means connected between one of said first and second power terminals and said output node and between said output node and said level shift control node for clamping said one of said first and second terminals to said output node and said output node to said level shift control node for one value of input signal and decoupling said one of said first and second terminals from said output node and said output node from said level shift control node for the other value of input signal;

a second, normally non-conductive, input signal responsive means for clamping said level shift control node to said other one of said first and second power terminals for the other value of input signal; and regenerative feedback means responsive to the voltage at said level shift control node for clamping said input terminal to said second power terminal in response to input signals of said second value.

2. The combination as claimed in claim 1 wherein said first means includes first and second transistors, said second means includes a third transistor, and said regenerative feedback means includes a fourth transistor; each transistor having a conduction path and a control electrode;

wherein the conduction path of said first transistor is connected between said one of said first and second terminals and said output node, wherein the conduction path of said second transistor is connected between said output and level shift control nodes, wherein the conduction path of said third transistor is connected between said level shift control node and said other one of said first and second power terminals;

wherein the conduction path of said fourth transistor is connected between said second power terminal and said input terminal and its control electrode is connected to said level shift control node; and wherein said input terminal is coupled to the control electrodes of said first, second, and third transistors for turning-on said first and second transistors and turning-off said third transistor for said one value of input signals, and turning-off said first and second transistors and turning-on said third transistor for said other value of input signal.

3. The combination as claimed in claim 2 wherein said first and second transistors are insulated-gate field-effect transistors (IGFETs) of one conductivity type;

wherein said third and fourth transistors are IGFETs of complementary conductivity type to said one conductivity type;

wherein said input terminal is coupled to the control electrodes of said first, second and third transistors by direct current connecting means;

wherein the potential applied to said one of said first and second power terminals is a first voltage approximately equal to said first value; and wherein the potential applied to said other one of said first and second power terminals is a second voltage, having a value such that said second value is intermediate said first and second voltages.

4. The combination as claimed in claim 3 further including:

(a) a second input terminal adapted to receive second input signals; and (b) means responsive to the signals at said second input terminal for selectively providing a low impedance conduction path either between said level shift control node and said output node or between said output node and said first power terminal.

5. The combination as claimed in claim 2 wherein said first, second and fourth transistors are insulated-gate field-effect transistors (IGFETs) of one conductivity type;

wherein said third transistor is an IGFET of complementary conductivity type to said one conductivity type;

wherein said input terminal is coupled to the control electrodes of said first, second and third transistors by direct current connecting means;

wherein the potential applied to said one of said first and second power terminals is a second voltage; and wherein the potential applied to said other one of said first and second power terminals is a first voltage, approximately equal to said first value, and said second value is intermediate said first and second voltages.

6. The combination as claimed in claim 5 further including:

(a) a second input terminal adapted to receive second input signals; and (b) means responsive to the signals at said second input terminal for selectively providing a low impedance conduction path either between said level shift control node and said output node or between said output node and said second power terminal.

7. The combination comprising:

first and second power terminals;

means for applying first and second voltages to said first and second terminals, respectively;

an input terminal adapted to receive input signals having either a first value approximately equal to said first voltage, or a second value intermediate said first and second voltages;

first, second, third and fourth transistors, each transistor having a conduction path and a control electrode;

means connecting the conduction path of said first transistor between said first power terminal and a first node;

means connecting the conduction path of said second transistor between said second power terminal and a second node;

means connecting the conduction path of said third transistor between said first and second nodes;

means connecting the conduction path of said fourth transistor between said input terminal and one of said first and second power terminals, and means connecting the control electrode of said fourth transistor to said first node;

means coupling the signal at the input terminal to the control electrodes of said first and second transistors for turning either one of them on and the other one of them off; and means coupling the signal at said input terminal to the control electrode of said third transistor for turning off said third transistor and decoupling said first node and the control electrode of said fourth transistor from said second node in response to one value of input signal, and for turning on said third transistor and providing a low impedance conduction path between said first and second nodes for the other value of input signal.

8. The combination comprising:

first and second power terminals;

means for applying first and second voltages to said first and second terminals, respectively;

an input terminal adapted to receive input signals having either a first value approximately equal to said first voltage, or a second value intermediate said first and second voltages;

a transistor having a conduction path and a control electrode, means connecting the conduction path of said transistor between said input terminal and said second power terminal;

means coupled between said first and second power terminals having an input connected to said input terminal and an output point connected to said control electrode of said transistor and being responsive to the signal at said input terminal for turning-on said transistor when the input signal has said second value, said transistor then providing a relatively low impedance conduction path between said input and second power terminals and the potential at said output point being either equal to said first voltage or said second voltage; and means coupled between said output point and an output terminal and between said output terminal and one of said first and second power terminals for either selectively coupling the signal at said output point to said output terminal or clamping said output terminal to said one of said first and second power terminals.

9. The combination as claimed in claim 8 wherein said means coupled between said first and second power terminals includes second, third and fourth transistors, wherein the conduction path of said second transistor is connected between said output point and one of said first and second power terminals, wherein the conduction paths of said third transistor is connected between said output point and said output terminal, wherein the conduction path of said fourth transistor is connected between said output terminal and the other one of said first and second power terminals; and wherein the control electrodes of said second, third and fourth transistors are coupled to said input terminal.

10. The combination as claimed in claim 9 wherein said first, second, third and fourth transistors are insulated-gate field-effect transistors (IGFETs);

wherein said second transistor is of one conductivity type and said third and fourth transistors are of opposite conductivity type to said one conductivity type.

11. The combination as claimed in claim 10 wherein said means coupled between said output point and an output terminal and between said output terminal and one of said first and second output terminals includes fifth and sixth transistor, said fifth transistor being of opposite conductivity type to said third transistor, and said sixth transistor being of like conductivity type to said fourth transistor, wherein the conduction path of said fifth transistor is connected in parallel with said third transistor between said output point and said output terminal;

wherein said sixth transistor is connected in parallel with said fourth transistor between said output terminal and said one of said first and second power terminals; and including means for applying control signals to the control electrodes of said fifth and sixth transistors for selectively turning either one of them on and the other one of them off.

12. The combination comprising:

first and second power terminals for the application therebetween of an operating potential;

a first input terminal adapted to receive an input signal having either a first value approximately equal to the potential applied to said first power terminal or a second value equal to a voltage intermediate the voltages applied to said first and second power terminals;

a second input terminal adapted to receive a control signal;

first, second, third, fourth, fifth and sixth transistors, each transistor having first and second electrodes defining the ends of a conduction path and a control electrode;

a first point;

an output terminal;

means connecting the conduction path of said first transistor between said first power terminal and said first point;

means connecting the conduction path of said second and third transistors in parallel between said first point and said output terminal;

means connecting the conduction paths of said fourth and fifth transistors in parallel between said output terminal and said second power terminal;

means coupling the control electrodes of said first, third and fourth transistors to said first input terminal for either turning on said first transistor and turning off said third and fourth transistors or turning off said first transistor and turning on said third and fourth transistors, means coupling the control electrodes of said second and fifth transistors to said second input terminal for selectively turning on either one of said second and fifth transistors and turning off the other one of said second and fifth transistors;

means coupling the conduction path of said sixth transistor between said first input terminal and one of said first and second power terminals; and means coupling the control electrode of said sixth transistor to said first point.

13. The combination as claimed in claim 12 wherein said first and second transistors are of the same one conductivity type, wherein said fourth and fifth transistors are of complementary conductivity type to said one conductivity type, and wherein one of said second and third transistors is of said one conductivity type and the other one of said second and third transistors is of complementary conductivity type to said one conductivity type.

14. The combination as claimed in claim 13 wherein said transistors are insulated-gate field-effect transistors (IGFETs).

15. The combination as claimed in claim 13 wherein said first and second transistors are of the same one conductivity type and wherein said third, fourth, fifth and sixth transistors are of the same complementary conductivity type to said one conductivity type; and wherein said means coupling the conduction path of said sixth transistor includes means connecting one end of the conduction path of said sixth transistor to said first input terminal and the other end of its conduction path to said second power terminal.

16. The combination as claimed in claim 12 wherein said first and sixth transistors are of the same conductivity type; and wherein said means coupling the conduction path of said sixth transistor include means connecting one end of its conduction path to said first input terminal and the other end of its conduction path to said first power terminal.

17. The combination comprising:

first and second power terminals;

means for applying first and second voltages to said first and second terminals, respectively, an input terminal adapted to receive input signals having either a first value approximately equal to said first voltage, or a second value intermediate said first and second voltages;

first, second, third and fourth transistors, each transistor having a conduction path and a control electrode;

means connecting the conduction path of said first transistor between one of said first and second power terminals and a first point;

means connecting the conduction path of said second transistor between said first point and an output terminal;

means connecting the conduction paths of said third and fourth transistors in parallel between said output terminal and the other one of said first and second power terminals;

means for applying a control signal to said second and fourth transistors for selectively turning either one of them on and the other one of them off;

input signal responsive means coupled between said first point and said output terminal for providing a low impedance conduction path between said first point and said output terminal when said first transistor is turned on; and means coupled between said input terminal and one of said first and second power terminals responsive to said input signals for providing a relatively low impedance conduction path between said input terminal and said one of said first and second power terminals when said input signal is equal to or exceeds said first value.

18. The combination comprising:

N level shift circuits, each having:

(a) first and second power terminals for the application therebetween of an operating potential;

(b) an input terminal adapted to receive input signals having either a first value approximately equal to the potential applied to said first power terminal or a second value equal to a voltage intermediate the voltages applied to said first and second power terminals;

(c) a level shift control node, and an output node;

(d) a first input signal responsive means including means connected between one of said first and second power terminals and said output node and between said output node and said level shift control node for clamping said one of said first and second terminals to said output node and said output node to said level shift control node for one value of input signal and decoupling said one of said first and second terminals from said output node and said output node from said level shift control node for the other value of input signal;

(e) a second, normally non-conductive, input signal responsive means for clamping said level shift control node to said other one of said first and second power terminals for the other value of input signal; and (f) regenerative feedback means responsive to the voltage at said level shift control node for clamping said input terminal to said second power terminal in response to the input signals of said second value, means connecting the output nodes of said N-level shift circuits, in common to an output terminal, N−1 transistors, each transistor having a conduction path and a control electrode, means connecting said N−1 transistors in series between the level shift control node of one of said level shift circuits and said output terminal; and means for applying N−1 signals to the control electrodes of said N−1 transistors said N−1 signals being other than the input signal applied to said one of said level shift circuits.

* * * * *